United States Patent
Kim et al.

(10) Patent No.: US 9,449,653 B2
(45) Date of Patent: Sep. 20, 2016

(54) MEMORY CHIP PACKAGE HAVING OPTICALLY AND ELECTRICALLY CONNECTED CHIPS, MEMORY SYSTEM HAVING THE SAME AND DRIVING METHOD THEREOF

(71) Applicants: Jeong-Kyoum Kim, Seoul (KR); Indal Song, Seoul (KR); Junghwan Choi, Hwaseong-si (KR)

(72) Inventors: Jeong-Kyoum Kim, Seoul (KR); Indal Song, Seoul (KR); Junghwan Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 14/094,813

(22) Filed: Dec. 3, 2013

(65) Prior Publication Data

US 2014/0268980 A1 Sep. 18, 2014

(30) Foreign Application Priority Data

Mar. 14, 2013 (KR) ........................ 10-2013-0027383

(51) Int. Cl.
*G11C 5/06* (2006.01)
*H01L 25/065* (2006.01)
*G11C 5/02* (2006.01)

(52) U.S. Cl.
CPC ............ *G11C 5/063* (2013.01); *G11C 5/025* (2013.01); *H01L 25/0657* (2013.01); *H01L 2224/16146* (2013.01); *H01L 2225/06513* (2013.01); *H01L 2225/06517* (2013.01); *H01L 2225/06534* (2013.01); *H01L 2225/06541* (2013.01); *H01L 2225/06565* (2013.01); *H01L 2924/00014* (2013.01)

(58) Field of Classification Search
CPC ...... G11C 5/025; G11C 5/063; G11C 7/1081; G11C 7/1054
See application file for complete search history.

(56) References Cited

U.S. PATENT DOCUMENTS

| | | | | |
|---|---|---|---|---|
| 5,200,631 A | * | 4/1993 | Austin | G02B 6/43 257/433 |
| 5,311,474 A | * | 5/1994 | Urban | G11B 7/00 365/106 |
| 7,271,461 B2 | * | 9/2007 | Dutta | G02B 6/12002 257/432 |

(Continued)

FOREIGN PATENT DOCUMENTS

| | | |
|---|---|---|
| JP | 2006084766 A | 3/2006 |
| JP | 2009-117810 A | 5/2009 |

(Continued)

OTHER PUBLICATIONS

"Corona: System Implications of Emerging Nanophotonic Technology," Computer Architecture, 2008. ISCA '08. 35th International Symposium on , vol., no., pp. 153,164, Jun. 21-25, 2008.*

*Primary Examiner* — Huan Hoang
*Assistant Examiner* — Roberto Mancera
(74) *Attorney, Agent, or Firm* — Volentine & Whitt, PLLC (57) ABSTRACT

A memory chip package includes memory chips stacked, electrically connected one another, and configured to input and output an optical signal through an optical line formed by a via penetrating the memory chips. The memory chips input and output optical signals with different wavelengths, and each of the memory chips has an optical-electrical converter configured to convert an optical signal with a corresponding wavelength into an electrical signal and to convert an electrical signal into an optical signal with the corresponding wavelength.

16 Claims, 8 Drawing Sheets

(56) References Cited

U.S. PATENT DOCUMENTS

| | | | |
|---|---|---|---|
| 7,366,368 B2* | 4/2008 | Morrow | H04J 14/0227 359/245 |
| 7,366,423 B2* | 4/2008 | Levy et al. | 398/164 |
| 7,466,884 B2* | 12/2008 | Beausoleil | B82Y 20/00 341/13 |
| 7,532,785 B1 | 5/2009 | Beausoleil et al. | |
| 7,851,809 B2 | 12/2010 | Zhou et al. | |
| 7,970,990 B2* | 6/2011 | Forrest | G11C 5/04 711/104 |
| 8,059,443 B2* | 11/2011 | McLaren | G11C 5/02 365/230.03 |
| 8,059,444 B2 | 11/2011 | Herner | |
| 8,064,739 B2* | 11/2011 | Binkert et al. | 385/14 |
| 8,546,955 B1* | 10/2013 | Wu | H01L 23/5384 257/686 |
| 8,547,769 B2* | 10/2013 | Saraswat | G11C 5/14 365/189.09 |
| 8,712,249 B2* | 4/2014 | Baker | G06F 13/16 398/162 |
| 9,054,805 B2* | 6/2015 | Ji | H04B 10/25 |
| 2003/0026141 A1* | 2/2003 | Cordes | G11C 5/04 365/200 |
| 2004/0047169 A1* | 3/2004 | Lee | G11C 5/063 365/63 |
| 2005/0224946 A1* | 10/2005 | Dutta | G02B 6/12002 257/686 |
| 2006/0069822 A1* | 3/2006 | Moriwaki | G06F 13/385 710/71 |
| 2006/0113598 A1* | 6/2006 | Chen et al. | 257/347 |
| 2007/0297713 A1* | 12/2007 | Lu | G02B 6/421 385/14 |
| 2008/0189475 A1* | 8/2008 | Lim | G06F 13/4243 711/103 |
| 2009/0103855 A1 | 4/2009 | Binkert et al. | |
| 2009/0114927 A1 | 5/2009 | Cho et al. | |
| 2010/0266240 A1* | 10/2010 | Krishnamoorthy | G02B 6/43 385/37 |
| 2010/0266276 A1* | 10/2010 | Zheng | G02B 6/2804 398/43 |
| 2010/0266295 A1* | 10/2010 | Zheng | H04B 10/801 398/201 |
| 2011/0134679 A1* | 6/2011 | Suh | G02B 6/4214 365/64 |
| 2012/0203957 A1* | 8/2012 | Schuette | G11C 7/1081 711/103 |
| 2012/0230695 A1* | 9/2012 | O'Krafka | G02B 6/43 398/87 |
| 2012/0314992 A1* | 12/2012 | Lee | G02B 6/428 385/14 |
| 2013/0028033 A1* | 1/2013 | Lim | G06F 13/4243 365/191 |
| 2013/0064496 A1* | 3/2013 | Suh | G02B 6/12007 385/14 |
| 2013/0279916 A1* | 10/2013 | Cho | H04B 10/801 398/115 |
| 2013/0308942 A1* | 11/2013 | Ji | H04B 10/25 398/45 |
| 2013/0320359 A1* | 12/2013 | Hummler | G02B 6/43 257/80 |
| 2014/0185352 A1* | 7/2014 | Chow | G11C 11/408 365/63 |
| 2014/0270785 A1* | 9/2014 | Kim | H04B 10/2575 398/115 |
| 2014/0355327 A1* | 12/2014 | Byun | G11C 5/063 365/64 |

FOREIGN PATENT DOCUMENTS

| | | |
|---|---|---|
| JP | 2010191740 A | 9/2010 |
| KR | 10-0452136 B1 | 1/2003 |
| KR | 10-0478379 B1 | 9/2003 |
| KR | 10-0941763 B1 | 12/2008 |
| KR | 10-2010-0087698 A | 8/2010 |

* cited by examiner

MEMORY CHIP PACKAGE HAVING OPTICALLY AND ELECTRICALLY CONNECTED CHIPS, MEMORY SYSTEM HAVING THE SAME AND DRIVING METHOD THEREOF

PRIORITY STATEMENT

A claim for priority under 35 U.S.C. §119 is made to Korean Patent Application No. 10-2013-0027383 filed Mar. 14, 2013, in the Korean Intellectual Property Office, the entire contents of which are hereby incorporated by reference.

BACKGROUND

The inventive concept described herein relates to a memory chip package, a memory system including a memory chip package, and a method of driving a memory chip package.

Efforts are constantly being undertaken in the electronics industry to lower the price of electronic products as well as to reduce their weight and size. At the same time, there is a demand for electronic products that operate at higher speeds and which offer higher performance. For these reasons, much research in the industry is aimed at scaling down and increasing the integration density of the semiconductor devices which make up the electronic products. One trend in this research is to provide a plurality of semiconductor chips in a single package.

SUMMARY

According to an aspect of the inventive concept, there is provided a memory chip package that includes a stack of memory chips optically and electrically connected one another, and in which the memory chips are configured in such a way that an optical signal of a plurality of wavelengths input to the package will be divided among the respective chips according to a respective wavelength (or frequency of wavelengths). The stack of the memory chips has a through-via extending therethrough, and the through-via constitutes an optical path extending to and from each of the memory chips and the outside of the stack and along which the optical signal can propagate. Each of the memory chips has an optical-electrical converter which is operative to convert optical and electrical signals input thereto to corresponding electrical and optical signals, respectively. The memory chips are configured in such a way that an optical signal of a respective wavelength or frequency only can be transmitted from the optical path to each optical-electrical converter and such that among the memory chips the one or more respective wavelengths are different from each other.

According to another aspect of the inventive concept, there is provided a memory system including a memory chip package and a memory controller configured to control the memory chip package, and in which the memory chip package comprises a stack of memory chips, and a logic chip including a circuit configured to drive the memory chip package, the memory chips have conductive vias by which the memory chips are electrically interconnected, the stack of memory chips has a through-via constituting an optical path extending to and from each of memory chips, each of the memory chips is operative to convert optical and electrical signals input thereto to corresponding electrical and optical signals, respectively, and the memory chips are configured in such a way that an optical signal of one or more respective wavelengths only can be transmitted from the optical path to each optical-electrical converter and such that among the memory chips the one or more respective wavelengths are different from each other.

According to still another aspect of the inventive concept, there is provided a method of driving a memory chip package which includes stacked memory chips, that includes assigning a respective wavelength or frequency to each of the memory chips using an electrical signal, and performing an operation in which an external device respectively communicates with at least one of the memory chips with an optical signal whose wavelength corresponds only to the wavelength or frequency assigned to the at least one memory chip, respectively.

According to still another aspect of the inventive concept, there is provided a method of fabricating a memory chip package, comprising forming a through silicon via vertically through a stack of memory chips, forming a waveguide in the through silicon via, and assigning a wavelength to each of the stacked memory chips.

BRIEF DESCRIPTION OF THE FIGURES

The inventive concepts will become more apparent from the following description of preferred embodiments made with reference to the following figures, of which.

DETAILED DESCRIPTION OF THE PREFERRED EMBODIMENTS

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will be understood that although the terms first, second, third etc. are used herein to describe various elements, chips, wavelengths, etc., these elements, chips, wavelengths are not limited by these terms. Rather, these terms are only used to distinguish one element, chip, wavelength from another.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

One embodiment of a memory chip package 10 according to the inventive concept will now be described in detail with reference to FIG. 1.

The memory chip package 100 includes a plurality of memory chips 110 to 140, and a logic chip 200 on which the memory chips 110 to 140 are stacked. The memory chip package may also include an interposer 300, i.e., the interposer 300 is optional. In the illustrated embodiment which includes the interposer 300, the interposer 300 is stacked on the logic chip 200, and the memory chips 110 to 140 are stacked on the interposer 300. Each of the memory chips 110 to 140 includes a memory device configured to store data. In this respect, each of the memory chips 110 to 140 may include a volatile memory device or a nonvolatile memory device. For example, each of the memory chips 110 to 140 may comprise a DRAM or a NAND flash memory. Also, the memory devices of the memory chips 110 to 140 may all be of a the same type, or the memory device of at least one of the memory chips 110 to 140 may be different from that/those of the other memory chip(s).

Figure 1:
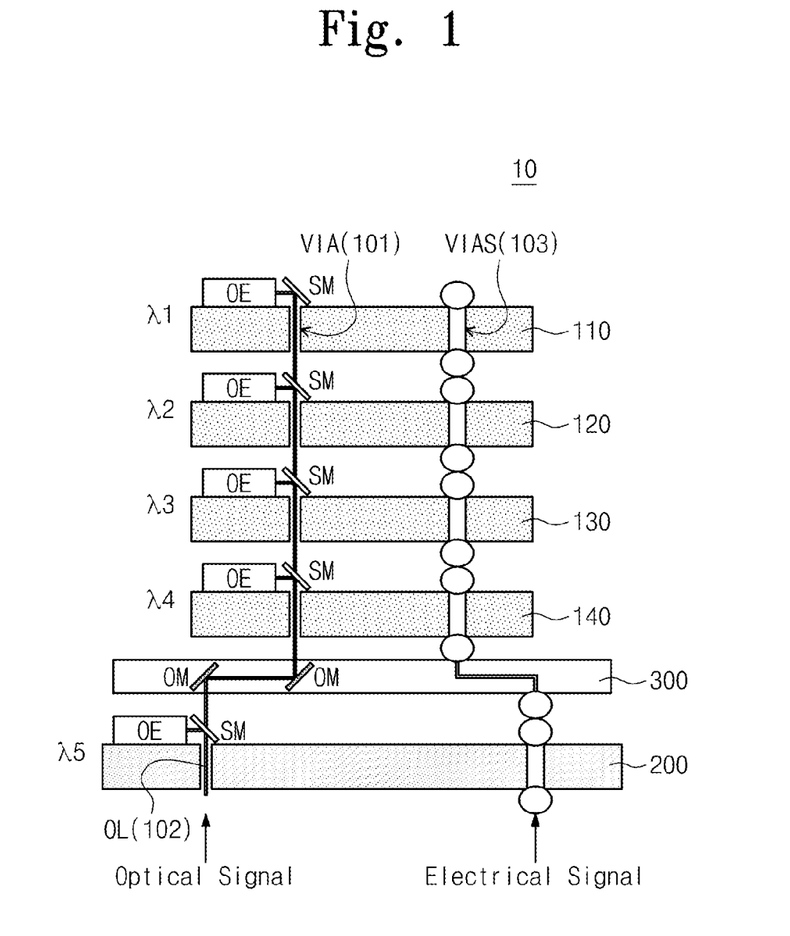
FIG. 1 is a schematic diagram of an embodiment of a memory chip package having memory chips and a logic chip, according to the inventive concept.

Also, although the memory chip package 100 is shown in FIG. 1 as having four memory chips, the inventive concept is not so limited and a memory chip package according to the inventive concept may have two, three or more than four memory chips.

In any case, the memory chips are interconnected electrically and optically. More specifically, with respect to the latter, the stack of memory chips 110 to 140 has an optical path connected to each of the chips and extending to the outside of the package. In this embodiment, an optical line 102 that extends through the memory chips 110 to 140 provides the optical path and the memory chips 110 to 140 are optically interconnected through the optical line 102. The optical path is facilitated or constituted by the provision of a through-via 101 of the stack of chips 110 to 140 (referred to hereinafter simply as "via 101"). In one example of this embodiment, the via 101 is a through silicon via (TSV) forming free space vertically through each (silicon) substrate of the chip in the stack, and the optical line 102 is a fiber or a waveguide extending through the via 101. In the case of the latter, the waveguide may be realized by burying an optical substance (optically transparent material) in the via 101.

Also, in the illustrated embodiment, each of the memory chips 110 to 140 can receive and output an optical signal independently of the other using the optical line 102, but the optical line 102 is common to all of the chips 110 to 140. Therefore, each of the memory chips 110 to 140 can receive or output an optical signal separately from the other chips or together with one or more of the other chips using the optical line 102.

Furthermore, the memory chips 110 to 140 are configured to receive and output optical signals of different wavelengths. For purposes of the example that follows, the first memory chip 110 is configured to receive and output an optical signal of a first wavelength $\lambda 1$, the second memory chip 120 is configured to receive and output an optical signal of a second wavelength $\lambda 2$, the third memory chip 110 is configured to receive and output an optical signal of a third wavelength $\lambda 3$, and the fourth memory chip 140 is configured to receive and output an optical signal of a fourth wavelength $\lambda 4$, wherein the first to fourth wavelengths $\lambda 1$ to $\lambda 4$ are different from one another.

The optical line 102 may transmit optical signals of different wavelengths $\lambda 1$ to $\lambda 4$ using wavelength division multiplexing (WDM).

Furthermore, each of the memory chips 110 to 140 has an optical-electrical converter OE operative to receive optical and electrical signals, convert the received optical or electrical signal into a corresponding electrical or optical signal, and output the converted electrical or optical signal. The optical-electrical converter OE may be a photo detector or a photo modulator or the like.

Furthermore, each of the memory chips 110 to 140 may include a semitransparent mirror SM (e.g., a programmable holographic semitransparent mirror) situated so as to receive optical signals transmitted along the optical line 102. The semitransparent mirror SM provides the optical-electrical converter OE with an optical signal, having a particular wavelength, from among the optical signals transmitted along the optical line 102. For example, as shown in FIG. 1, the semitransparent mirror SM of the memory chip 140 is disposed in the path of the optical line 102 and is designed or programmed to reflect an optical signal having a wavelength of $\lambda 4$ to the optical-electrical converter OE of the chip 140 while allowing optical signals of the other wavelengths $\lambda 3$, $\lambda 2$, $\lambda 1$ to pass therethrough and thereby continue propagating along the optical line 102 towards the other memory chips 130, 120 and 110. The other semitransparent mirrors function in a similar manner.

Of course, other types of optical couplings, which are wavelength or frequency selective, may be used instead of the semitransparent mirrors SM to receive optical signals from the optical line 102 and transmit an optical of a selected wavelength/frequency to the optical-electrical converter OE.

As was also mentioned above, the memory chips 110 to 140 are electrically connected. In the embodiment illustrated in FIG. 1, the memory chips 110 to 140 are electrically connected through conductive vias 103 discrete from the optical path but alternatively, may be electrically connected through other wiring schemes. The vias 103 or other wiring schemes may allow the memory chips 110 to 140 to be driven independently from one another or simultaneously.

The logic chip 200 includes a logic circuit that drives the memory chip package 10. The logic circuit may be an interface circuit. The logic chip 200, like each of the memory chips 110 to 140, includes an optical-electrical converter OE and a semitransparent mirror SM (or other optical coupling), and is configured to receive and output optical signals having a respective wavelength, referred to as a fifth wavelength $\lambda 5$ for purposes of description.

As is also illustrated in FIG. 1, the size of the logic chip 200 is different from that of each of the memory chips 110 to 140 stacked. The interposer 300 is provided to facilitate the mounting and connection of the stack of memory chips 110 to 140 on the logic chip 200. In this example, the interposer 300 includes opaque mirrors OM and a waveguide to transmit optical signals between the logic chip 200 and the memory chips 110 to 140. On the other hand, the interposer 300 includes a redistribution wiring layer to transmit electrical signals selectively between the logic chip 200 and the memory chips 110 to 140.

In some cases, a respective wavelength or frequency is assigned to each of the memory chips 110 to 140 and the logic chip 200 using an electrical signal provided by an external device (e.g., a memory controller) through a conductive line connected to the chips. In this case, each of the memory chips 110 to 140 and the logic chip 200 are recognized by the external device through an exchange of electrical signals therebetween. Alternatively, a respective wavelength or frequency is assigned to each of the memory chips 110 to 140 and the logic chip 200 by the manufacturer at a package fabricating level. Each of the memory chips 110 to 140 and the logic chip 200 exchanges an optical signal having the assigned wavelength(s) with an external device. In either case, as a result, each of the memory chips 110 to 140 and the logic chip 200 receives and outputs only an optical signal having the wavelength(s) assigned to the chip.

Figure 2:
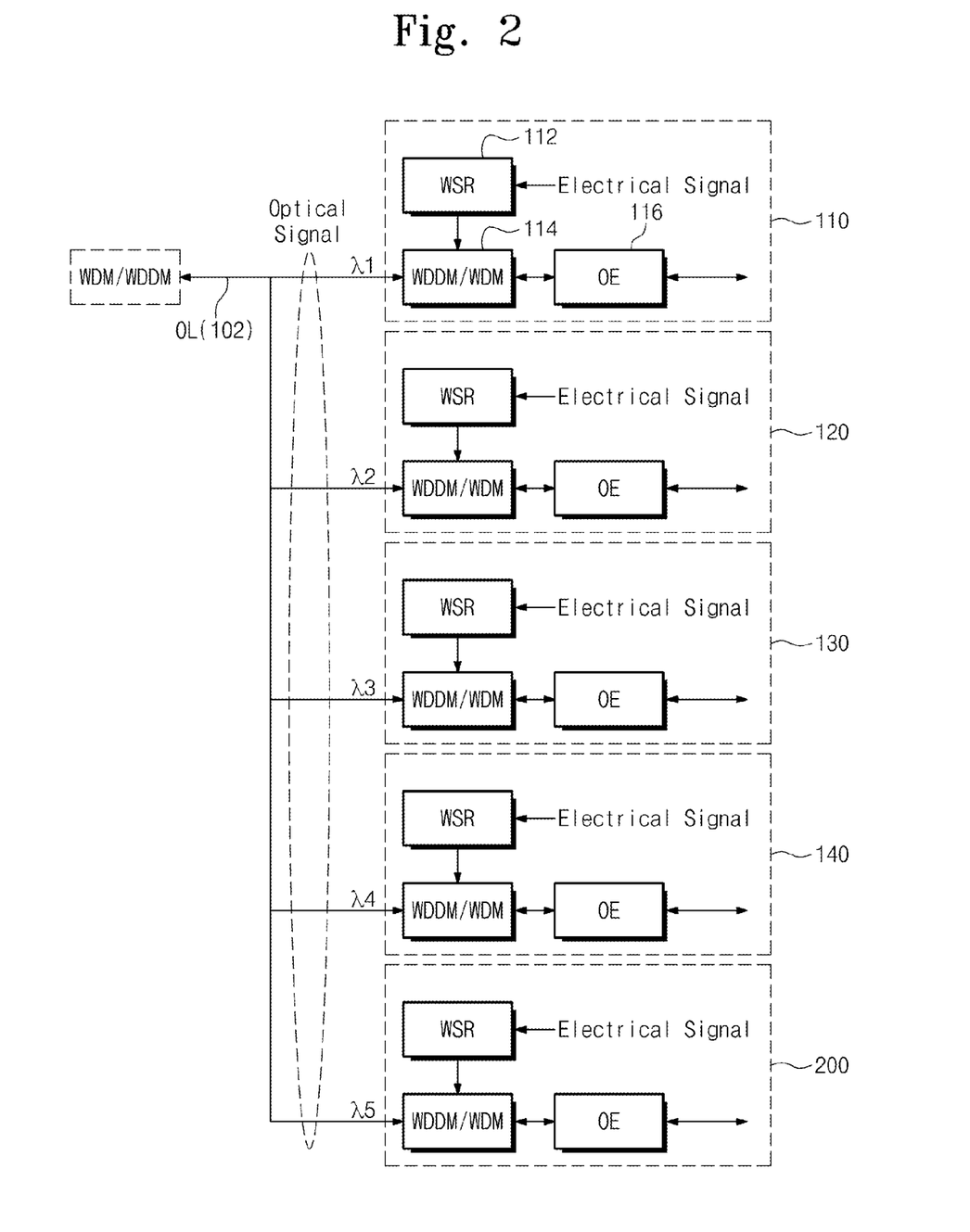
FIG. 2 is a block diagram of a memory chip package of FIG. 1, illustrating an exchange of optical signals between the chips and an external device.

FIG. 2 illustrates in more detail the means by which a wavelength is assigned to each of the memory chips 110 and the logic chip 200, and by which the memory chips 110 to 140 and logic chip 200 exchange optical signals with an external device as a result. FIG. 2 shows that each of memory chips 110 to 140 and a logic chip 200 include a wavelength selection register WSR, a wavelength division demultiplexer/multiplexer (WDDM/WDM), and the optical-electrical converter OE. Here, the WDDM/WDM may be the (programmable) semitransparent mirror SM in the illustrated embodiment of FIG. 1 or may be any other type of optical coupling that may be optically modulated as was referred to in connection with the description of FIG. 1.

Now, an input process associated with a memory chip will be described in detail. For this purpose, an input process associated with the first memory chip 110 will be described.

An external wavelength division demultiplexer/multiplexer WDDM/WDM multiplexes optical signals input thereto and transmits the multiplexed optical signal having a plurality of wavelengths to the optical line 102. The WDDM/WDM 114 of the first memory chip 110 demultiplexes/multiplexes optical signals according to a value stored in the wavelength selection register 112. In this case, the value stored in the wavelength selection register 112 corresponds to the first wavelength λ1. An electrical signal is used to write the value, corresponding to the first wavelength λ1, in the wavelength selection register 112. Here, the electrical signal may be provided by an external device through the conductive line of the package 10 (refer to FIG. 1).

Accordingly, the WDDM/WDM 114 demultiplexes the multiplexed optical signal transmitted through the optical line 102 and transmits a demultiplexed optical signal of a first wavelength λ1, i.e., the optical signal of a first wavelength λ1 contained in the multiplexed optical signal, to the optical-electrical converter 16.

The optical-electrical converter 116 converts the demultiplexed optical signal input thereto by the WDDM/WDM 114 into an electrical signal. The electrical signal is sent to the memory device of the first memory chip 110.

An output process associated with a memory chip is similar to that of the above-described input process. Again, using the first memory chip 100 as an example, an electrical signal from the first memory chip 110 is converted into an optical signal with the first wavelength λ1 by the optical-electrical converter 116. The optical signal is coupled to the optical signal of the optical line 102 through the WDDM/WDM 114. Accordingly, the optical signal with the first wavelength λ1 is transmitted through the optical line 102 to the external WDDM/WDM.

According to an aspect of the inventive concept, the memory chips of the memory chip package 10 can be separately or simultaneously driven using an optical signal transmitted to an optical line 102. Thus, the memory chip package 10 has a comparatively high interconnection bandwidth and can transfer data at high speeds.

Figure 3:
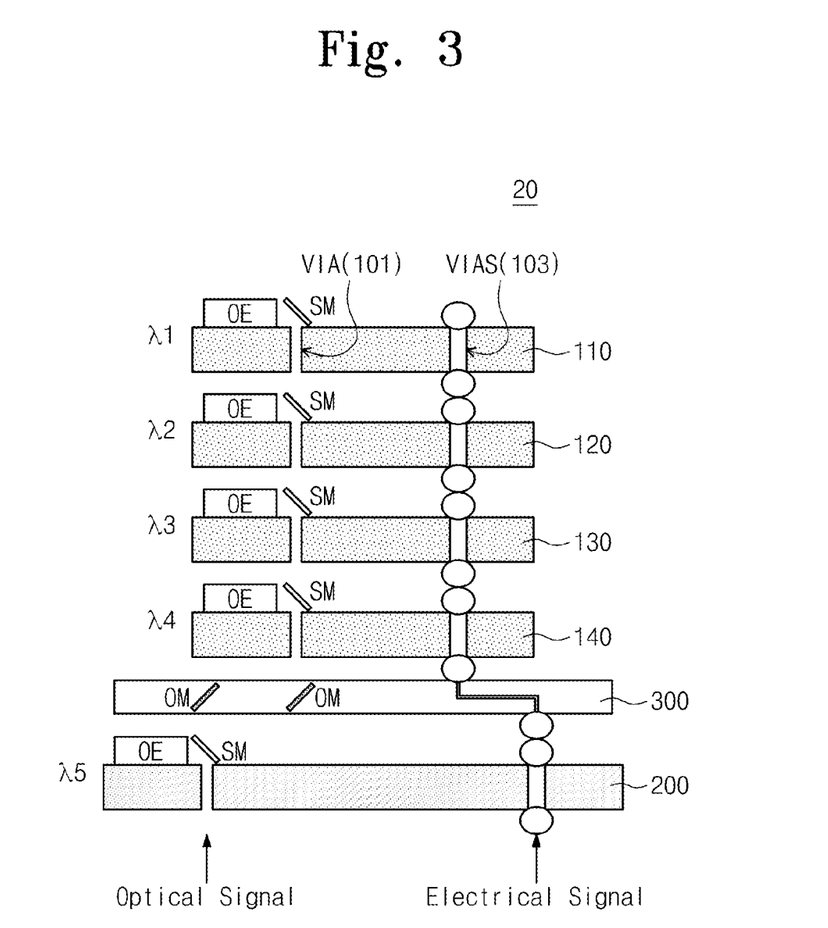
FIG. 3 is a schematic diagram of a second embodiment of a memory chip package according to the inventive concept.

FIG. 3 illustrates a second embodiment of a memory chip package 20 according to the inventive concept. Referring to FIG. 3, a memory chip package 20 is similar to the memory chip package 10 in FIG. 1 except that instead of an optical line 102, the optical signals are transmitted in the package 20 to/from the chips through the via 101.

Figure 4:
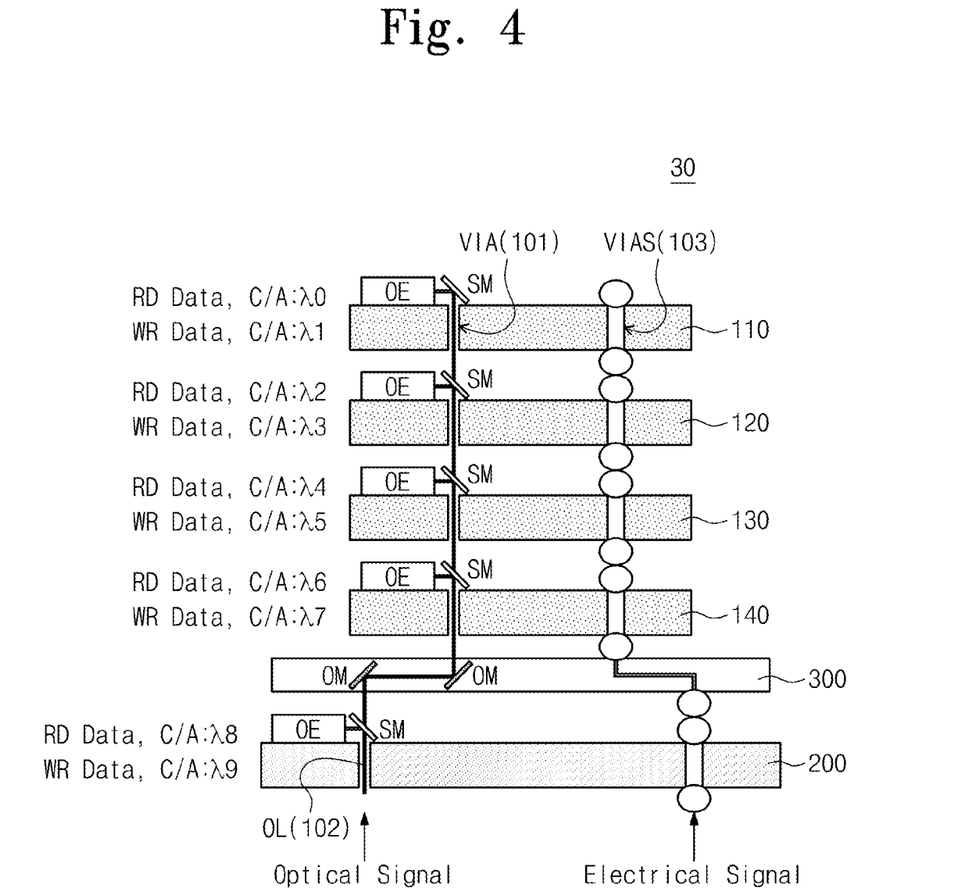
FIG. 4 is a schematic diagram of a third embodiment of a memory chip package according to the inventive concept.

FIG. 4 illustrates a third embodiment of a memory chip package 30 according to the inventive concept. The memory chip package 30 is different from the memory chip package 10 in FIG. 1 in that the wavelength of an optical signal for a read operation of each chip is different from the wavelength of an optical signal for a write operation of the chip. For example, in a first memory chip 110, data and commands/addresses for a read operation may be input and output using an optical signal with a wavelength λ0, and data and commands/addresses for a write operation may be input and output using an optical signal with a wavelength λ1. Accordingly, each of the memory chips 110 to 140 can perform a read operation and a write operation at the same time. To this end, each of memory chips 110 to 140 may include a buffer for a read operation and a buffer for a write operation.

Figure 5:
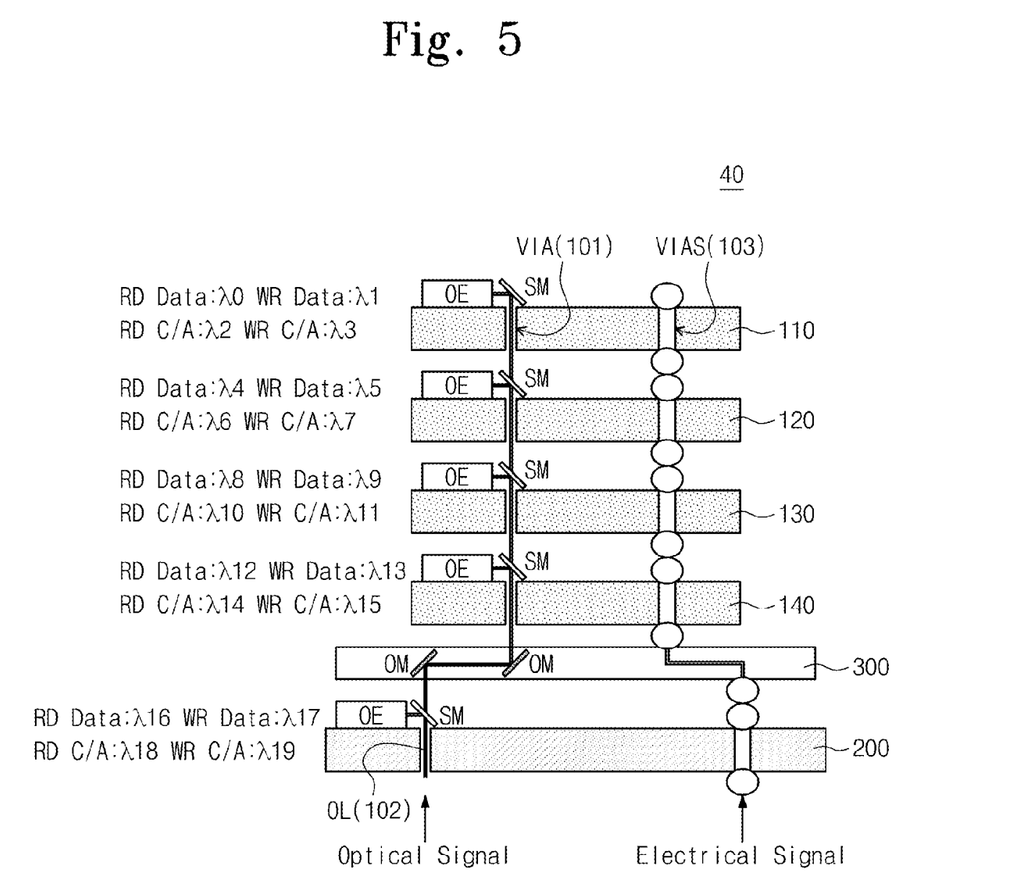
FIG. 5 is a schematic diagram of a fourth embodiment of a memory chip package according to the inventive concept.

FIG. 5 illustrates a fourth embodiment of a memory chip package 40 according to the inventive concept. The memory chip package 40 is similar to the memory chip package 30 of FIG. 4 except that the wavelength of an optical signal for a data transfer of each chip is different from a wavelength of an optical signal for a command/address transfer of the chip. For example, in a first memory chip 110, data with a wavelength λ0 is output at a read operation, data of a wavelength λ1 is input at a write operation, a command/address with a wavelength λ2 is output at a read operation, and a command/address of a wavelength λ3 is input at a write operation.

Accordingly, a sequential read/write operation may be performed more rapidly than a conventional sequential read/write operation. For example, in a conventional case, after a read operation on a command is completed, a next read or write operation may be performed only once the next command has been received. However, since a wavelength of an optical signal used as data is different from a wavelength of an optical signal used as a command/address, the memory chip package 40 may receive a subsequent command to perform a read/write operation immediately after the previous command has been received regardless of whether an operation based on the previous command has been completed.

And, although the inventive concepts apply with respect to read operation and/or write operations, the inventive concepts are not so limited and may be used in connection with other operations performed by multi-chip packages in the art.

Figure 6:
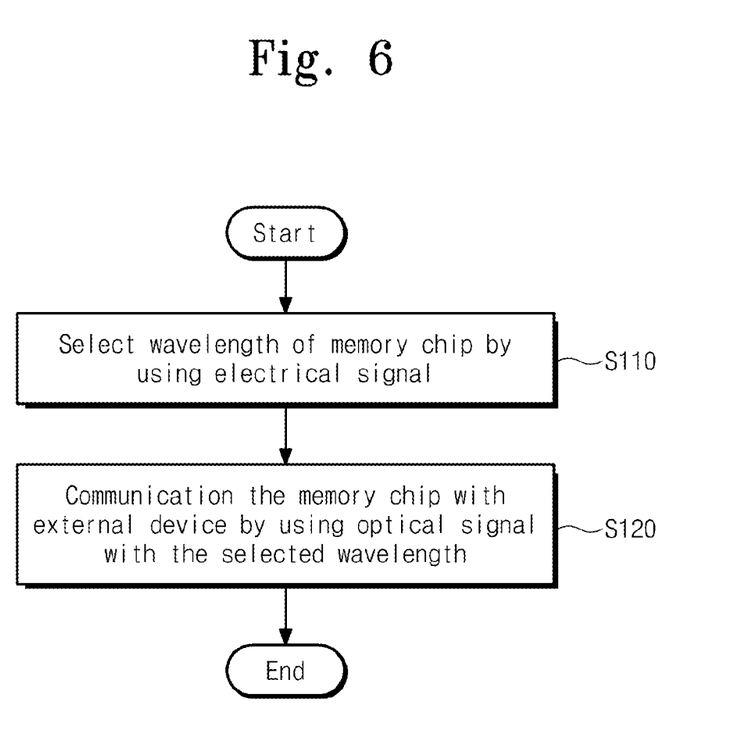
FIG. 6 is a flow chart illustrating an embodiment of a memory chip package driving method according to the inventive concept.

A memory chip package driving method according to the inventive concept will now be described with reference to the flow chart of FIG. 6, and applies to any of the chip packages 10, 20, 30 and 40 described above. In step S110, each of the memory chips 110 to 140 is/are essentially programmed using an electrical signal so as to be "drivable" by an optical signal of a selected wavelength or frequency. By "drivable" it is meant that the chip can only receive and output optical signals of the respective wavelength or frequency. In step S120, each of the memory chips 110 to 140 communicates (e.g., exchanges data) with an external device using an optical signal having the selected wavelength.

In step S110, each of the memory chips 110 to 140 may be programmed such that the wavelength of an optical signal input that the chip can receive from an external device is different from the wavelength of an optical signal that the chip outputs. For example, each of the memory chips 110 to 140 may be programmed such that the wavelength of an optical signal by which data can be read from the memory device of the chip is different from the wavelength of an optical signal by which data can be written to the memory device of the same chip. As another example, each of the memory chips 110 to 140 is programmed such that the wavelength of an optical signal containing data that is transferred using the chip is different from the wavelength of an optical signal containing a command/address in connection with the transfer of data using the chip.

In step S120, the memory chips 110 to 140 communicate with an external device simultaneously or only one or some at a time.

A method of fabricating a memory chip package according to the inventive concept will now be described with reference to the flowchart of FIG. 7, and using the embodiment of FIG. 1 as an example. In step S210, a through silicon via 101 is formed in stacked memory chips 110 to 140. In step S220, a waveguide 102 is formed by filling the through silicon via 101 with an optical substance (transparent material), i.e., by burying the optical substance in the via 101. In step S230, wavelengths are assigned to the stacked memory chips 110 to 140, respectively. As was mentioned above, the wavelengths may be assigned to the stacked memory chips 110 to 140 by the manufacturer (during the fabricating of the package 10) or by the end user (using an external electrical signal transmitted to the package 10 by an external device electrically connected to the package 10).

Figure 7:
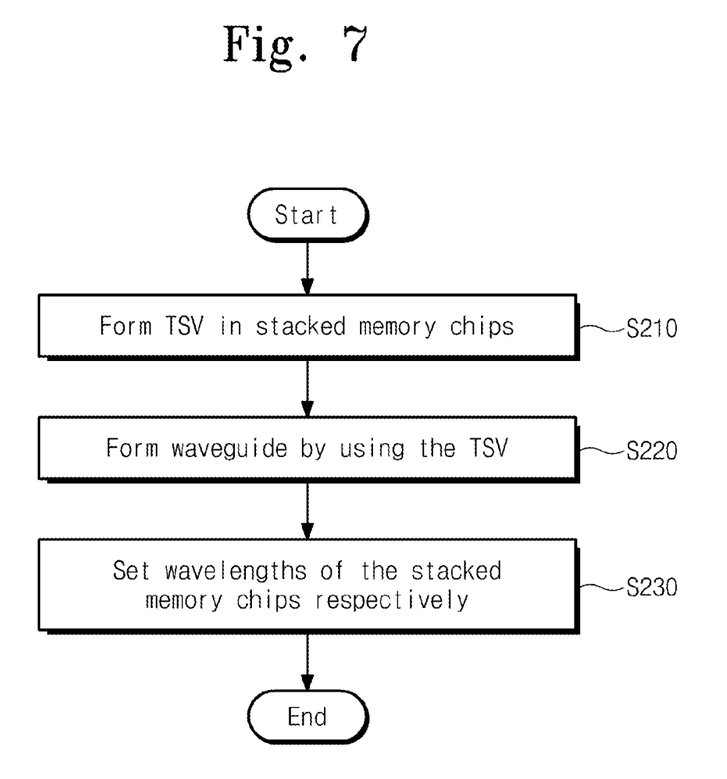
FIG. 7 is a flow chart of an embodiment of a method of fabricating a memory chip package according to the inventive concept.

Also, and although not shown in FIG. 7, a plurality of conductive vias may be formed through substrates of each of the memory chips 110 to 140 for electrically interconnecting the memory chips 110 to 140.

Figure 8:
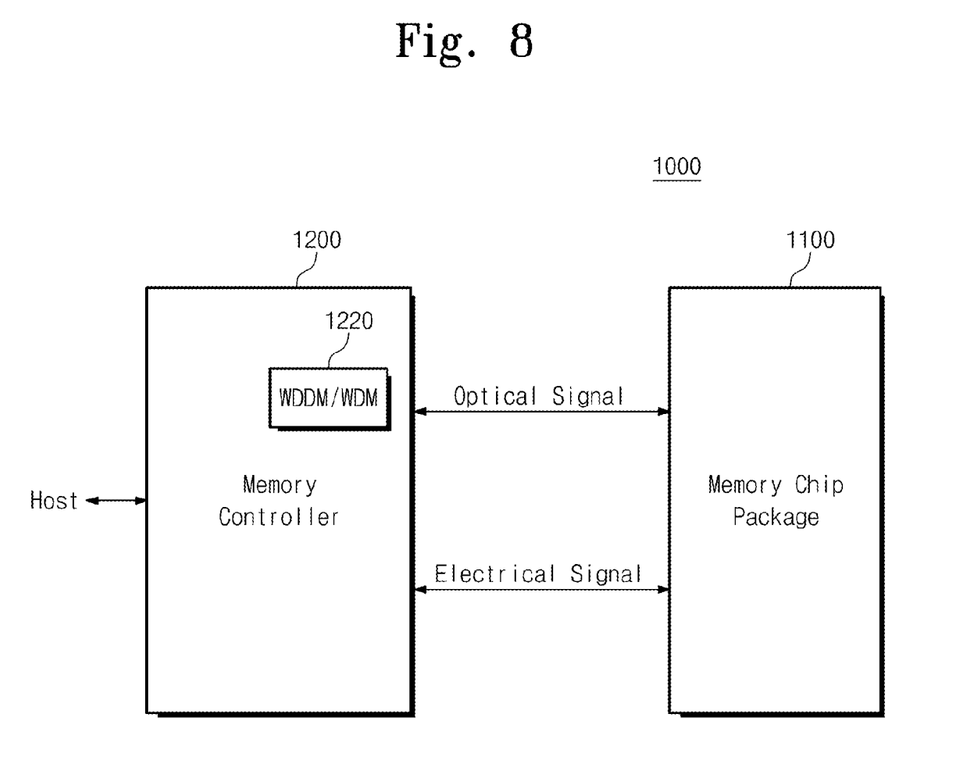
FIG. 8 is a block diagram of a memory system according to the inventive concept.

A memory system 1000 according to the inventive concept is illustrated in FIG. 8. The memory system 1000 may be a device including an electronic display.

The memory system 1000 includes a memory chip package 1100 and a memory controller 1200 controlling the memory chip package 1100. The memory chip package 1100 may be embodied as any of the memory chip packages 10, 20, 30 and 40 shown in and described with reference to FIGS. 1, 3, 4 and 5. The memory chip package 1100 may be stacked on the memory controller 1200 or vice versa. Also, the memory chip package 1100 and the memory controller 1200 may be mounted together on a substrate.

The memory controller 1200 includes a wavelength division demultiplexer/multiplexer 1220 configured to receive and output optical signals with different wavelengths. The wavelength division demultiplexer/multiplexer 1220 demultiplexes an optical signal with multiple wavelengths, transmits the demulitiplexed optical signal along an optical line, multiplexes the demultiplexed optical signal, and outputs the multiplexed optical signal with multiple wavelengths to an optical line.

As illustrated in FIG. 8, the memory chip package 1100 and the memory controller 1200 communicate with each other using both optical and electrical signals.

A memory system or a storage device according to the inventive concept may be realized in any of various forms of packages such as a PoP (Package on Package), Ball grid array (BGA), Chip scale packages (CSP), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A memory chip package comprising:
a stack of memory chips electrically connected one another, the stack of the memory chips having a through-via extending therethrough, and the through-via constituting an optical path extending to and from each of the memory chips and the outside of the stack;
a logic chip atop which the memory chips are stacked and configured to drive the memory chip package, and
wherein each of the memory chips includes an optical-electrical converter which is operative to convert optical and electrical signals input thereto to corresponding electrical and optical signals, respectively, and a register programmable by an electrical signal input from an external device,
the register is configured to store at least one value corresponding to one or more respective wavelengths of an optical signal,
the memory chips are configured in such a way that an optical signal of the one or more respective wavelengths only can be transmitted from the optical path to each optical-electrical converter and such that among the memory chips the one or more respective wavelengths are different from each other, and
the logic chip is configured to receive and output an optical signal only of a wavelength different from each of those that can be transmitted from the optical path to the optical-electrical converters of the memory chips.

2. The memory chip package of claim 1, wherein the optical path is constituted by free spaces extending through substrates of each of the memory chips.

3. The memory chip package of claim 1, wherein the optical path is constituted by an optical substance buried in the through-via.

4. The memory chip package of claim 3, wherein the optical path is constituted by an optical fiber.

5. The memory chip package of claim 1, wherein the memory chips comprise optical couplings, respectively, that optically couple the optical-electrical converters of the memory chips to the optical path and configure the memory chips such that optical signals of different wavelengths only can be transmitted from the optical path to the optical-electrical converters, respectively.

6. The memory chip package of claim 1, wherein the memory chips comprise semitransparent mirrors, respectively, that optically couple the optical-electrical converters of the memory chips to the optical path and configure the memory chips such that optical signals of different wavelengths only can be transmitted from the optical path to the optical-electrical converters, respectively.

7. The memory chip package of claim 1, further comprising:
an interposer optically or electrically interconnecting the memory chips and the logic chip.

8. The memory chip package of claim 5, wherein the register of each of the memory chips is operatively connected to the optical coupling of the memory chip to configure the optical coupling based on the at least one value.

9. The memory chip package of claim 8, wherein the optical coupling of each of the memory chips is a wavelength division demultiplexer/multiplexer.

10. The memory chip package of claim 1, wherein a wavelength of an optical signal used at a read operation of each memory chip is different from a wavelength of an optical signal used at a write operation of each memory chip.

11. The memory chip package of claim 1, wherein a wavelength of an optical signal used as data of each memory chip is different from a wavelength of an optical signal used as a command/address of each memory chip.

12. The memory chip package of claim 1, wherein at least one of the memory chips comprises a volatile memory device.

13. The memory chip package of claim 1, wherein at least one of the memory chips comprises a nonvolatile memory device.

14. The memory chip package of claim 8, wherein each of the memory chips has an electrically conductive via therethrough electrically connected to the register of the memory chip, whereby the register of each of the memory chips is programmable by an electrical signal input from an external device to the electrically conductive vias.

15. The memory chip package of claim 14, wherein the logic chip has an electrically conductive via extending between the first and second sides of the logic chip and electrically connected to the electrically conductive vias of the memory chips.

16. A memory chip package comprising:

a stack of memory chips electrically connected one another, the stack of the memory chips having a through-via extending therethrough, and the through-via constituting an optical path extending to and from each of the memory chips and the outside of the stack; and a logic chip atop which the memory chips are stacked and configured to drive the memory chip package, wherein each of the memory chips has an optical-electrical converter which is operative to convert optical and electrical signals input thereto to corresponding electrical and optical signals, respectively, the memory chips are configured in such a way that an optical signal of one or more respective wavelengths only can be transmitted from the optical path to each optical-electrical converter and such that among the memory chips the one or more respective wavelengths are different from each other, and wherein the logic chip is configured to receive and output an optical signal only of a wavelength different from each of those that can be transmitted from the optical path to the optical-electrical converters of the memory chips.

* * * * *